United States Patent
Tanaya (10) Patent No.: US 7,863,804 B2
(45) Date of Patent: Jan. 4, 2011

(54) PIEZOELECTRIC VIBRATION ELEMENT AND PIEZOELECTRIC DEVICE

(75) Inventor: Hideo Tanaya, Suwa (JP)

(73) Assignee: Seiko Epson Corporation (JP)

(*) Notice: Subject to any disclaimer, the term of this patent is extended or adjusted under 35 U.S.C. 154(b) by 0 days.

(21) Appl. No.: 12/466,035

(22) Filed: May 14, 2009

(65) Prior Publication Data

US 2009/0218917 A1 Sep. 3, 2009

Related U.S. Application Data

(62) Division of application No. 11/427,042, filed on Jun. 28, 2006, now Pat. No. 7,550,905.

(30) Foreign Application Priority Data

Jun. 29, 2005 (JP) .............................. 2005-189680

(51) Int. Cl.
H01L 41/04 (2006.01)
(52) U.S. Cl. ........................ 310/370; 310/320
(58) Field of Classification Search ................ 310/320, 310/321, 370; 333/200; 73/504.02
See application file for complete search history.

(56) References Cited

U.S. PATENT DOCUMENTS

| | | | |
|---|---|---|---|
| 6,707,234 B1 | 3/2004 | Kawashima | |
| 6,806,797 B2 | 10/2004 | Kikushima | |
| 7,067,966 B2 | 6/2006 | Tanaya | |
| 7,193,354 B2 | 3/2007 | Kawashima | |
| 7,253,554 B2* | 8/2007 | Dalla Piazza et al. | ....... 310/370 |
| 7,342,352 B2 | 3/2008 | Kawashima | |
| 7,365,478 B2 | 4/2008 | Kawashima | |
| 2001/0054860 A1 | 12/2001 | Knowles | |
| 2004/0245894 A1* | 12/2004 | Tanaya et al. | ................ 310/348 |
| 2005/0017604 A1 | 1/2005 | Yamada | |
| 2009/0102327 A1 | 4/2009 | Kawashima | |

FOREIGN PATENT DOCUMENTS

| | | |
|---|---|---|
| JP | 54-037488 | 3/1979 |
| JP | 56-034216 | 4/1981 |
| JP | 11-199400 | 7/1999 |
| JP | 2002-261575 | 9/2002 |
| JP | 2004-007428 | 1/2004 |
| JP | 2005-039767 | 2/2005 |
| JP | 2005-109741 | 4/2005 |

* cited by examiner

Primary Examiner—Thomas M Dougherty
Assistant Examiner—Derek J Rosenau
(74) Attorney, Agent, or Firm—Harness, Dickey & Pierce, P.L.C.

(57) ABSTRACT

A piezoelectric vibration element having a favorable drive level characteristic for miniaturization, and a piezoelectric oscillator. The piezoelectric vibration element includes a base made of a piezoelectric material, a plurality of vibration arms extended from the base, a long groove formed along a longitudinal direction of a main surface of each of the plurality of vibration arms, and an exciting electrode provided inside the long groove. A center position in a width dimension of the long groove is decentered in a minus X-axis direction from a center position of an arm width dimension.

13 Claims, 7 Drawing Sheets

PIEZOELECTRIC VIBRATION ELEMENT AND PIEZOELECTRIC DEVICE

CROSS-REFERENCE TO RELATED APPLICATIONS

This is a divisional application of U.S. Ser. No. 11/427,042 filed Jun. 28, 2006 claiming priority to Japanese Patent Application 2005-189680 filed Jun. 29, 2005, all of which are expressly incorporated by reference herein.

FIELD

The present invention relates to a piezoelectric vibration element and a piezoelectric device including the piezoelectric vibration element in its package or case.

BACKGROUND

Piezoelectric devices, including a piezoelectric vibration element, a piezoelectric oscillator and the like, have been widely used for small information equipment, such as HDD (hard disc drive), mobile computers, IC cards, and for mobile communications equipment such as cellular phones, carphones, and paging systems, and piezoelectric gyro sensors, etc.

Figure 10:
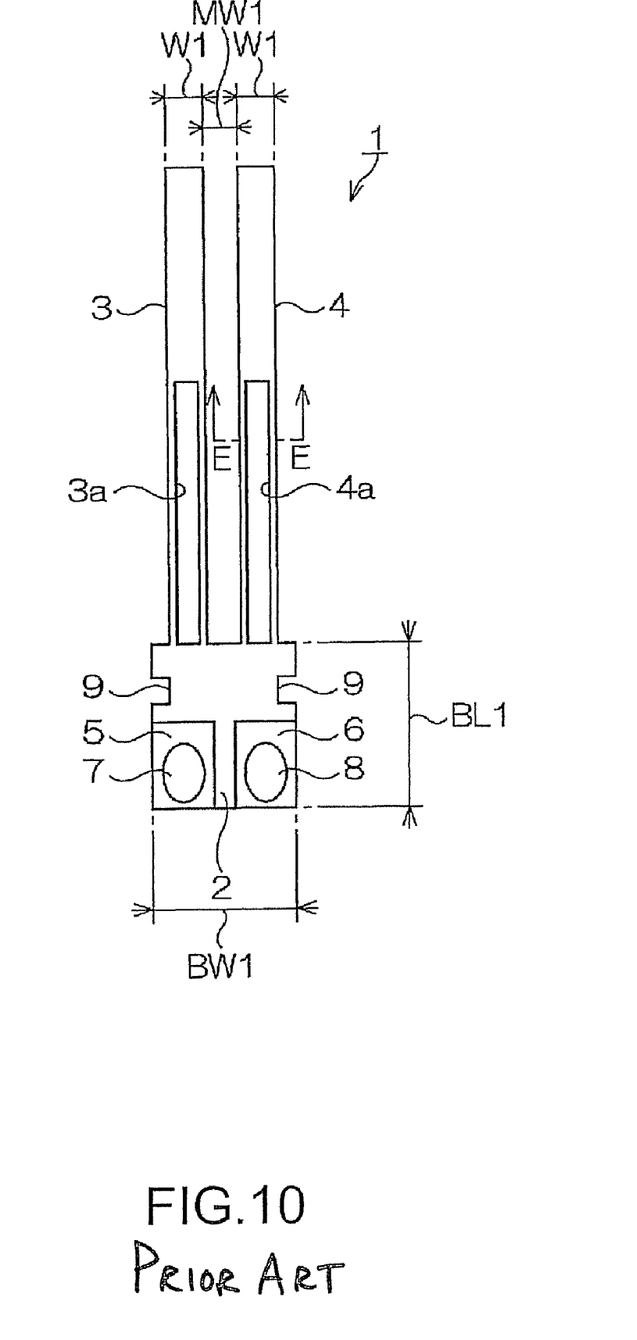
FIG. 10 is a schematic plan view of a conventional piezoelectric vibration element.

FIG. 10 is a schematic plan view illustrating an example of a piezoelectric vibration element conventionally used in the piezoelectric devices.

In the figure, a piezoelectric vibration element 1, whose shape shown in the figure is formed by etching a piezoelectric material such as quartz or the like, is provided with a base 2 having a rectangular shape, which is mounted to a package (not shown) or the like, and a pair of vibration arms 3 and 4, which extends from the base 2 in the vertical direction as viewed in the figure. Long grooves 3a and 4a are formed on the main surfaces (front and back surface) of vibration arms, and necessary driving electrodes are formed.

In the piezoelectric vibration element 1, when a driving voltage is applied via driving electrodes, the vibration arms 3 and 4 perform a flexural vibration so that their distal parts are moved closer and then apart, resulting in a signal having a given frequency being taken out.

Here, the piezoelectric vibration element 1, in which lead-out electrodes are formed at the positions indicated as numerals 5 and 6 on the base 2, is fixed to a base body such as a package or the like with adhesives 7 and 8 applied on the lead-out electrodes.

After fixing and supporting with the adhesive, cut parts 9 are formed to the base 2 so that the flexural vibration of the vibration arms is prevented from being hindered by a remaining stress caused by the differences in the linear expansion coefficient between the material of the package or the like, and the material of the piezoelectric vibration element.

In the piezoelectric vibration element 1, as a result of miniaturization, the width W1 of each of the vibration arms 3 and 4 is approximately 100 μm, the distance MW1 between them is approximately 100 μm, and the width BW1 of the base 2 is approximately 500 μm. These parts are miniaturized, so that the length BL1 of the base is accordingly shortened, thereby the piezoelectric vibration element 1 is miniaturized.

Figure 11:
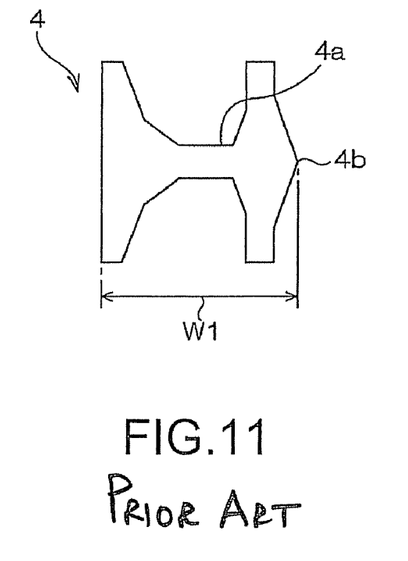
FIG. 11 is a sectional-view taken along the line E-E of the piezoelectric vibration element in FIG. 10.

FIG. 11 is a sectional view taken along the line E-E of the vibration arm 4 in FIG. 10. In the figure, the width of the arm is W1 and exciting electrodes are not shown. In this regard, the vibration arm 3 also has the same sectional view.

Figure 12:
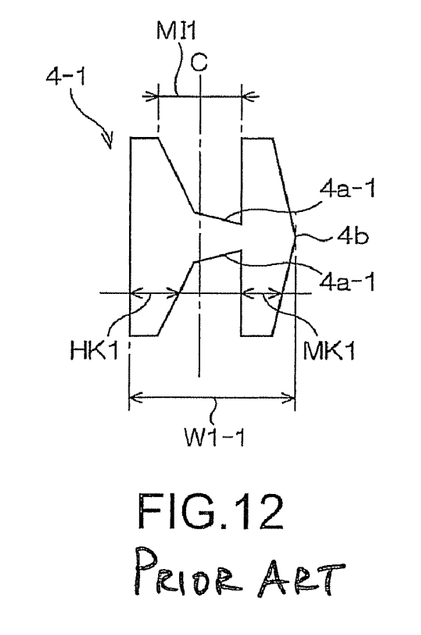
FIG. 12 is a sectional-view of a vibration arm when a piezoelectric vibration element is miniaturized.

The piezoelectric vibration element shows a shape shown in FIG. 12 when it is further miniaturized.

In a vibration arm 4-1 of the piezoelectric vibration element shown in the figure, the width dimension MI1 of a long groove 4a-1 for forming a driving exciting electrode becomes small when the arm width dimension is reduced to the arm width W1-1.

When quartz crystal is wet etched, etching progress is delayed in a predetermined direction due to its etching anisotropy. As a result, a protrusion or protruded part (hereinafter, called as "fin") having a fin shape shown as indicated as numeral 4b is produced as an irregular shaped part.

If the arm width W1-1 of the vibration arm 4-1 is determined by taking the protruded dimension of a fin 4b into consideration, the arm width W1-1 is determined smaller. Accordingly, a CI (crystal impedance) value increases when a required frequency is adjusted based on the following formula: frequency (f)=k (coefficient)·W (vibration arm width)/(1(vibration arm length)×1). Namely, reducing the width of a vibration arm for miniaturization results in increasing of CI value.

As for the shape of the vibration arm 4-1 in FIG. 12, the fin 4b can be reduced when etching time for an outer shape etching of a piezoelectric vibration element is taken for a long time. As a result, field effect can be improved.

However, in this case, there is a large difference in a dimension between the thicknesses of MK1 and HK1 of walls sandwiching the long groove 4a-1 when the width dimension MI1 of the long groove 4a-1 is small.

Namely, the difference in a dimension between the thicknesses of MK1 and HK1 of walls sandwiching the long groove 4a-1 is not much improved due to a poor circulation of an etchant in a narrow groove width, and an anisotropy in etching.

In this condition, the virtual centerline C passing the center of the width dimension MI1 of the long groove 4a-1 is shifted from the gravity center position in the width direction of the vibration arm 4-1.

Figure 13:
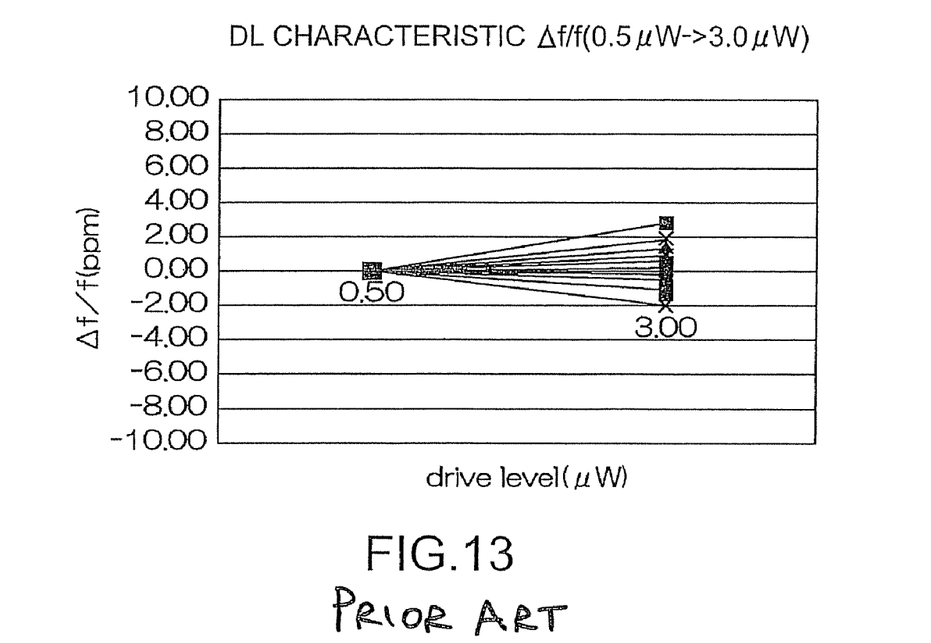
FIG. 13 is a graph illustrating a drive level characteristic of the piezoelectric vibration element in FIG. 10.

Accordingly, frequencies may shift to the minus side as shown in FIG. 13 when drive level characteristics of a piezoelectric vibration element are checked. As a result, a piezoelectric vibration element having favorable characteristics may not be achieved.

SUMMARY

The present teachings aim to provide a piezoelectric vibration element having a favorable drive level characteristic for miniaturization, and a piezoelectric device.

The aim is achieved by a piezoelectric vibration element that includes a base made of a piezoelectric material, a plurality of vibration arms extended from the base, a long groove formed along a main surface of the plurality of vibration arms, and an exciting electrode provided inside the long groove. In the piezoelectric vibration element, a center position in a width dimension of the long groove is decentered in a minus X-axis direction from a center position of an arm width dimension.

The thicknesses of walls sandwiching the long groove provided to the vibration arm differ due to an anisotropy etching in a process to form a piezoelectric vibration element. The thickness is thicker in the minus X side. Accordingly, the center position of the width dimension of the long groove does not coincide with the gravity center position in the width direction of the vibration arm when the long groove is conventionally formed at a position. As a result, the flexural vibration of vibration arms is harmed.

Therefore, a treatment is carried out to reduce or remove an irregular shaped part that is on the side face of each vibration arm and protrudes in a plus X-axis (electrical axis) direction. According to this structure, the irregular shaped part produced by an anisotropy etching is formed so as to be the minimum when the outer shape of the piezoelectric vibration element is formed by wet etching. This makes the flexural vibration of vibration arms stable.

In addition, by decentering the center position in the width dimension of the long groove in the minus X-axis direction, i.e. by shifting the center position in the width dimension of the long groove in the minus X-axis direction, the center position in the width dimension of the long groove becomes close to the gravity center position in the width direction of the vibration arm. This allows a weight balance of the right and left vibration arms to be adjusted. This also makes it possible to achieve a stable flexural vibration of vibration arms even though a piezoelectric vibration element is miniaturized with a small groove width of a long groove, and a fin reduced in size. As a result, a piezoelectric vibration element having an excellent drive level characteristic can be provided.

Another aspect of the present teachings is characterized in that a distance dimension m1 between an outer edge of the long groove and an outer edge of the vibration arm in a plus X-axis direction side is larger than a distance dimension m2 between an outer edge of the long groove and an outer edge of the vibration arm in a minus X-axis direction side.

The distance dimension between the outer edge of the long groove formed to the vibration arm and the outer edge of the vibration arm needs to be provided at both plus and minus X-axis sides, thereby electrodes are reliably polarized. However, this dimension realizes a structure in which the center position in the width dimension of the long groove is shifted in the minus X-axis direction by setting the distance dimension m1 in the plus X-axis side larger than the distance dimension m2 in the minus X-axis side.

Each vibration arm may further include a shrunk width part in which the arm width dimension is gradually shrunk from the base toward a distal side and a changing point P that is in the distal side. From the changing point P, the arm width dimension is equally continued or increased toward the distal side, and the changing point P is located closer to the distal side of each vibration arm than an end of the long groove, in the structure of the first or second invention.

An oscillation with the second harmonic wave can be prevented while CI value is suppressed by providing the changing point P when a driving electrode (exciting electrode) is formed in the long groove formed to the vibration arm. The arm width is decreased from the base toward the distal side. From changing point P, which is in the distal side, the arm width is increased.

A fourth invention is characterized in that each vibration arm further includes a first shrunk width part in which the arm width dimension is sharply reduced toward the distal side from a footing part of each vibration arm with respect to the base, and a second shrunk width part in which the arm width dimension is gradually reduced further toward the distal side from an end of the first shrunk width part as the shrunk width part.

An oscillation with the second harmonic wave can be prevented while CI value is suppressed by providing the second shrunk width part in which the arm width dimension is gradually reduced further toward the distal side from an end of the first shrunk width part, and the changing point P, which is in the distal side and from which the arm width is increased.

In addition, since the first shrunk width part, in which the arm width dimension is sharply reduced toward the distal side from the footing part of each vibration arm with respect to the base, is provided, the stiffness of the footing part can be improved at which the largest stress is applied so as to produce a large strain when vibration arms perform a flexural vibration. This stabilizes the flexural vibration of vibration arms and suppresses a vibration component in an unwanted direction, enabling CI value to further decrease. Accordingly, a stable flexural vibration can be achieved in miniaturizing a piezoelectric vibration element, enabling CL value to be lowered.

The piezoelectric vibration element may further include a supporting arm that is extended in a width direction from another end side of the base having a predetermined length and extended in a common direction with the vibration arms outboard the vibration arms, and another end side is located by the predetermined distance from one side of the base, and the vibration arm extends from the one side of the base, in the structure of any of the first to fourth inventions.

Where the supporting arm is bonded to a base body such as a package by adhesive bonding or the like, a stress change, which is produced at the bonding position due to the change of surrounding temperature or drop shock or the like, is hardly affected to the vibration arms from the bonding position of the supporting arm through the other end of the base, and further, through the distance of the given length of the base. As a result, particularly, the temperature characteristic shows well.

Also, in contrast, the vibration leakage from the vibration arms that perform the flexural vibration is hardly propagated, since the vibration leakage is reached to the supporting arm spaced apart from the base through the given length of the base. Namely, if the length of the base is extremely short, it can be considered that a situation difficult to be controlled occurs since a leaked component of the flexural vibration spreads over the supporting arms. However, such situation is thoroughly avoided according to the present teachings.

In addition to the advantageous effects, since the supporting arms are extended from the other end of the base in the width direction, and extended in the same direction of the vibration arms at outside of the vibration arms, the whole size can be made compact.

A through hole may be disposed at a position, which is closer to the vibration arms than the connecting part at which the supporting arm is integrally connected to the base, of the base.

The through hole is disposed at the position, which is closer to the vibration arms than the connecting part at which the supporting arm is integrally connected to the base. This makes it possible to further suppress a vibration leakage without largely lowering the stiffness of the base compared to a case in which a cut part is formed deep to the side edge of the base instead of the through hole.

The base may be provided with a cut part formed by reducing the base in the width direction, in the structure of any of the first through sixth inventions.

The cut part formed by reducing a part of the side edge of the base in the width direction is provided instead of or in addition to the through hole. This suppresses a vibration leakage caused by a flexural vibration of vibration arms to propagate to the connecting part of the supporting arm through the base, thereby increasing CI value can be pretended or be more reliably prevented.

The cut part may be formed to the base with a distance of 1.2 times of the arm width or more from the footing part of each vibration arm, in the structure of the seventh invention.

The position at which the cut part is provided at a position that is more than the arm width dimension W2 of the vibration arm from the footing part of vibration arm in view of the following: there is a correlation between a region in which a vibration leakage propagates and the arm width dimension W2 of vibration arms when vibration arms of a tuning folk type resonator element perform a flexural vibration. Accordingly, the structure of the cut part can reliably suppress a vibration leakage from vibration arms to propagate to the base side. As a result, a piezoelectric vibration element can be provided which has a favorable drive level characteristic and adequately prevents a leakage of a vibration from vibration arms to the base side.

A piezoelectric device may be provided with a piezoelectric vibration element contained in a package or a case, and the piezoelectric vibration element includes a base made of a piezoelectric material, a plurality of vibration arms extended from the base, a long groove formed along a main surface of the plurality of vibration arms, and an exciting electrode provided inside the long groove. In the piezoelectric vibration element, a center position in a width dimension of the long groove is decentered in a minus X-axis direction from a center position of an arm width dimension.

A compact piezoelectric device can be provided which uses a piezoelectric vibration element that has an excellent drive characteristic and can achieve a stable flexural vibration of vibration arms with a small groove width and a tiny fin in miniaturization by the same principle of the first invention.

DETAILED DESCRIPTION

Figure 1:
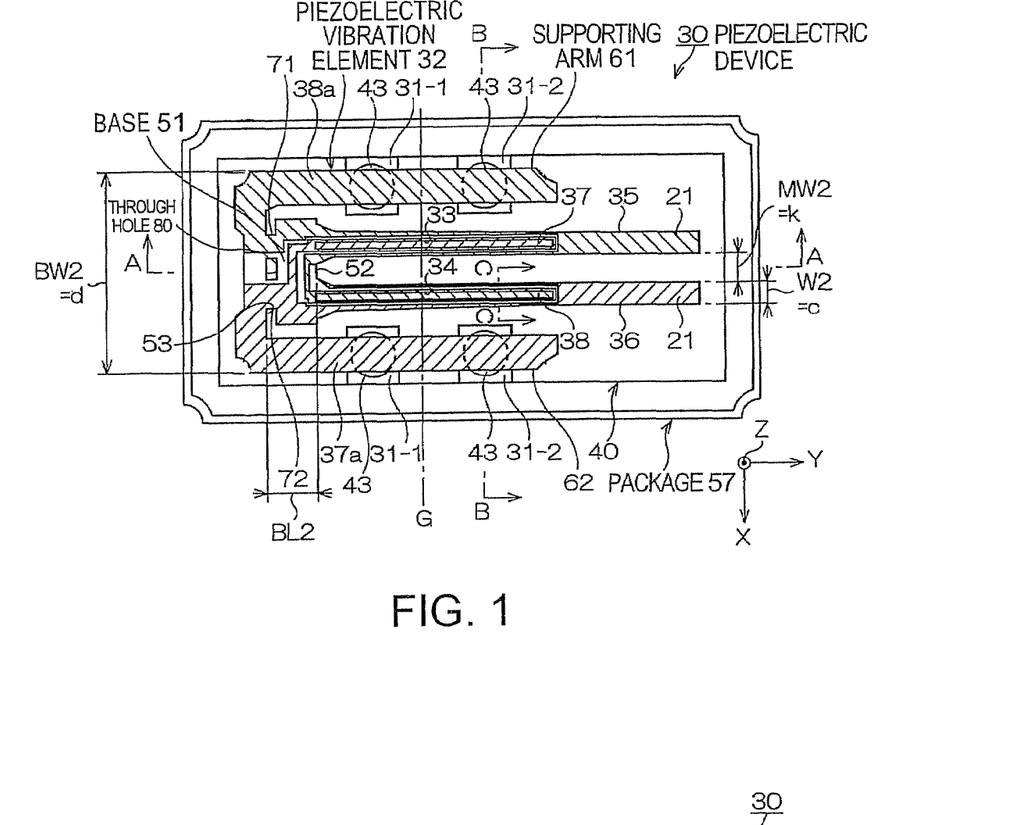
FIG. 1 is a schematic plan view showing a piezoelectric device according to one embodiment of the invention.
Figure 2:
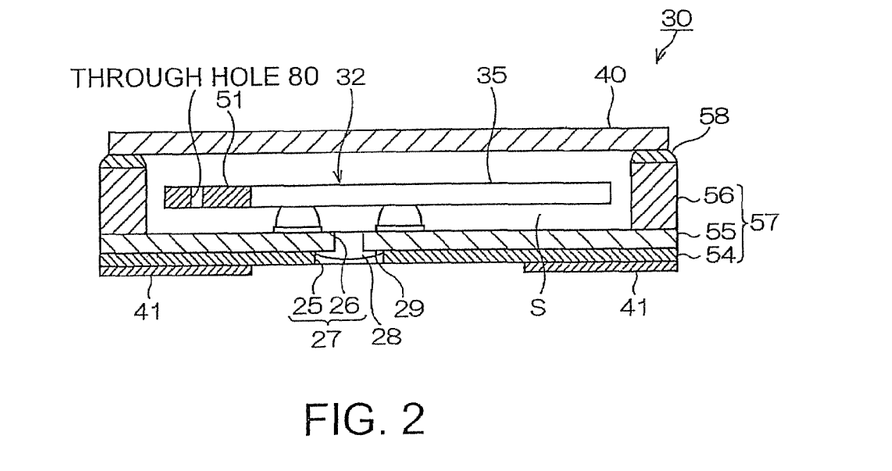
FIG. 2 is a sectional-view taken along the line A-A of FIG. 1.
Figure 3:
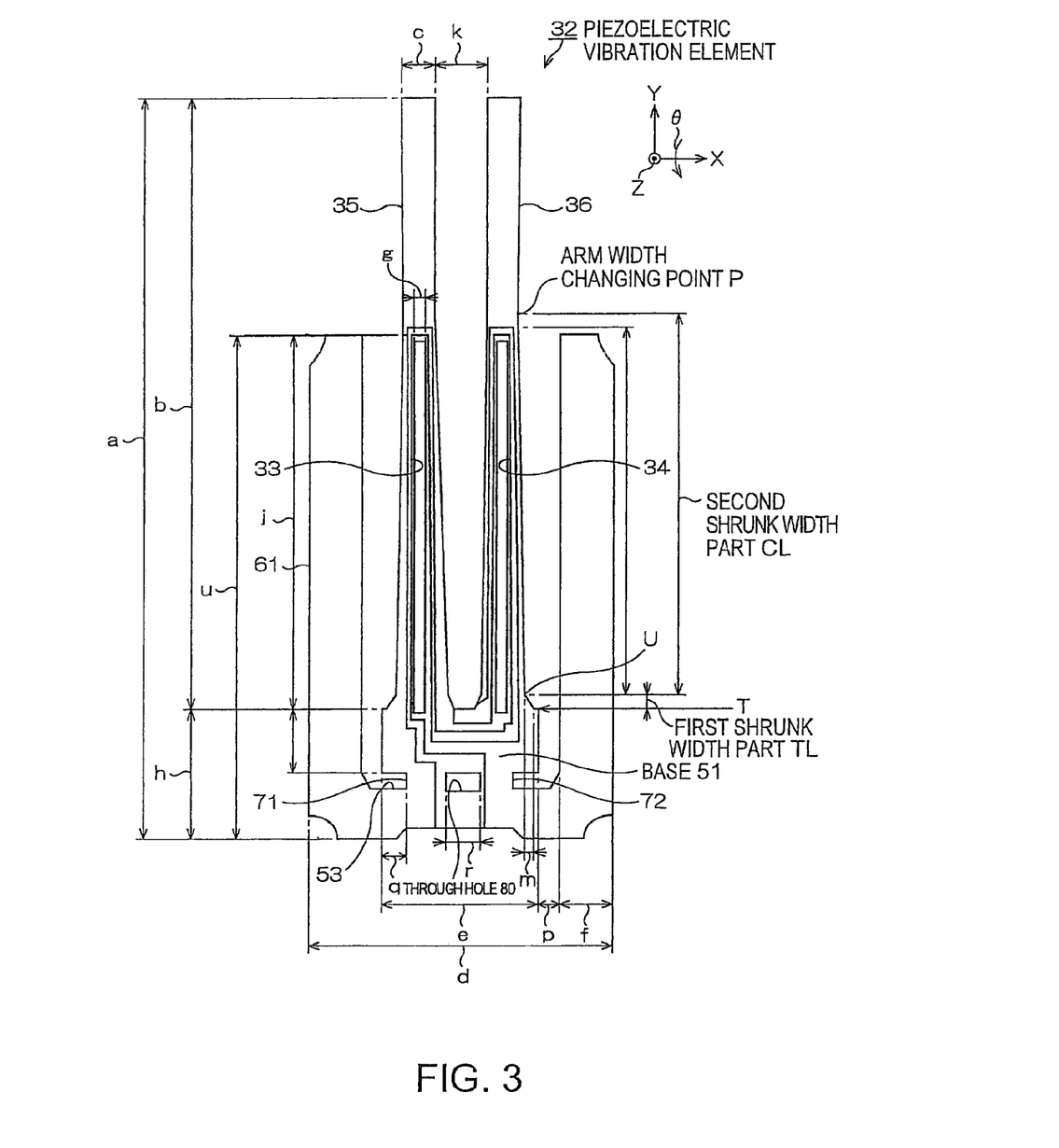
FIG. 3 is a schematic enlarged plan view of a piezoelectric vibration element used in the piezoelectric device in FIG. 1.
Figure 4:
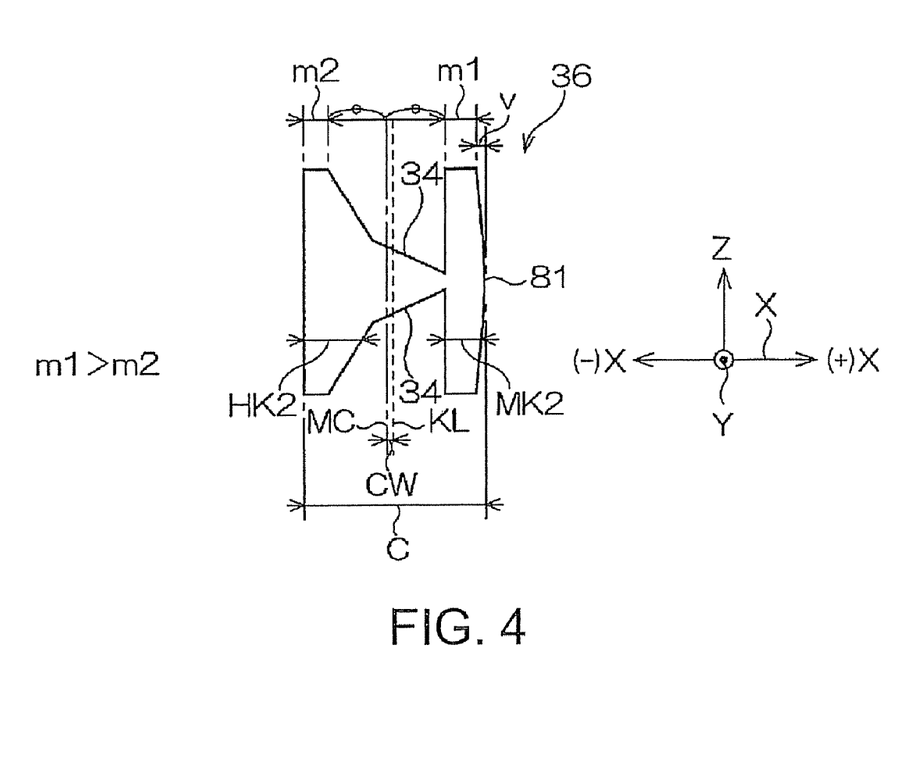
FIG. 4 is a sectional-view taken along the line C-C on the vibration arms in FIG. 1.
Figure 5:
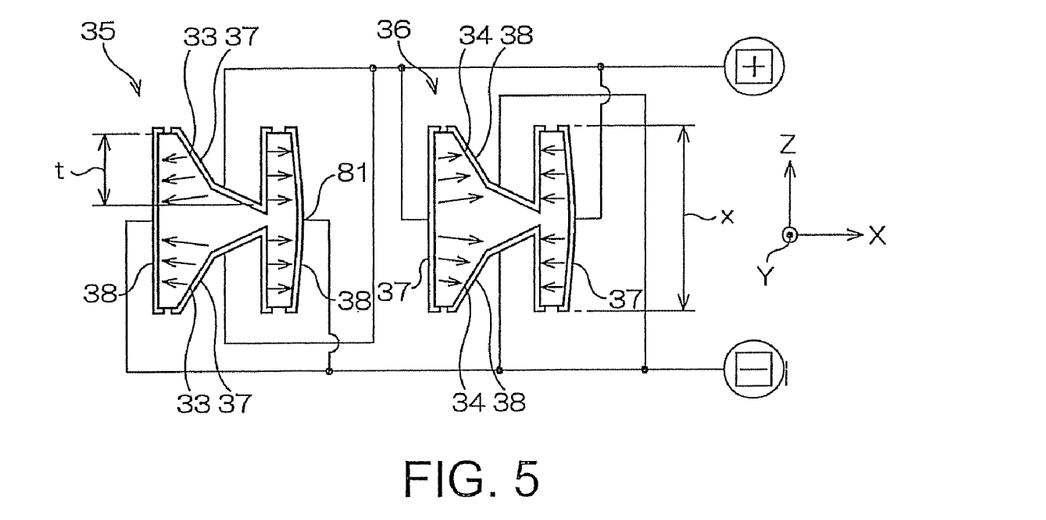
FIG. 5 is a sectional-view taken along the line B-B on the vibration arms in FIG. 1.

FIGS. 1 and 2 show a piezoelectric device according to an embodiment of the present teachings. FIG. 1 is a schematic plan view thereof, and FIG. 2 is a schematic sectional-view taken along the line A-A in FIG. 1. In addition, FIG. 3 is an enlarged plan view to explain the details of a piezoelectric vibration element 32 in FIG. 1. FIG. 4 is a schematic sectional-view taken along the line C-C in FIG. 1. FIG. 5 is a schematic sectional-view taken along the line B-B on vibration arms in FIG. 1.

Referring to the drawings, a piezoelectric device 30 includes a piezoelectric vibration element. The piezoelectric device 30 houses a piezoelectric vibration element 32 in a package 57 serving as a base body.

The package 57 is formed, for example, in a rectangular box shape as shown in FIGS. 1 and 2. Specifically, the package 57 is formed by laminating a first substrate 54, a second substrate 55, and a third substrate 56. For example, it may be formed as follows: a ceramic green sheet made of aluminum oxide is formed as an insulation material; the sheet is formed in a shape as shown in the figures; and then fired.

A through hole 27 for degassing during manufacturing processes is disposed at the bottom of the package 57. The through hole 27 is provided with a first hole 25 formed to the first substrate 54, and a second hole 26 formed to the second substrate 55. The second hole 26 has an outer diameter smaller than the first hole 25, and communicates to the first hole 25.

The through hole 27 is sealed by filling a sealing member 28 to make the inside of the package 57 airtight.

The package 57 includes the inner space S formed by removing the material inside the third substrate 56 as shown in FIG. 2. The inner space S is a space for housing the piezoelectric vibration element 32. Positions of supporting arms 61 and 62 of the piezoelectric vibration element 32 are placed and bonded to each of the electrode parts 31-1 and 31-2 formed on the second substrate 55 with each adhesive 43. On each of the positions, a lead-out electrode, which will be described later, is formed.

Since the supporting arms 61 and 62 have the same shape, the supporting arm 61 will be explained referring to FIG. 3. The length dimension u is required to be from 60% to 80% of the whole length a of the piezoelectric vibration element 32 in order to achieve a stable supporting structure.

In addition, a low stiffness part or structure (not shown), which is, for example, a cut part or shrunk width part, may be disposed at a part of a position between the bonding position of the supporting arm 61 and the base 51. As a result, reducing a CI value or the like can be expected.

Further, outside corner parts of the supporting arms 61 and 62 are chamfered in an R-shaped manner, which is convexed outwardly or inwardly, preventing the supporting arms 61 and 62 from being damaged due to a crack, or the like.

The bonding position to the supporting arm, for example, regarding the supporting arm 61, can be chosen to be only one part corresponding to the gravity center position G of the length dimension of the piezoelectric vibration element 32. However, it is preferable that, as shown in the embodiment, the electrode parts 31-1 and 31-2 are chosen to be two points spaced apart at the same distance from the gravity center position located therebetween so as to be bonded. As a result, the bonding structure is further strengthened.

When bonding one supporting arm at one point, it is preferable for achieving a sufficient bonding strength that the length of a region for applying an adhesive is maintained so as to be 25% or more of the whole length a of the piezoelectric vibration element 32.

When providing two bonding points as shown in the embodiment, it is preferable for achieving a sufficient bonding strength that the distance between the bonding positions is 25% or more of the whole length a of the piezoelectric vibration element 32.

In addition, after fixing and supporting the piezoelectric vibration element 32 with the conductive adhesive 43, remaining stress is present in the base 51. The remaining stress is caused by the difference in linear expansion coefficient between the materials of the piezoelectric vibration element 32 and the package 57, and the like.

Here, at least one set of the electrode parts 31-1 and 31-2 among the electrode parts 31-1 and 31-2 is connected to the mounting terminals 41 on the backside of the package via conductive through holes and the like. The package 57 is hermetically sealed in a vacuum by bonding a lid 40, which is made of glass and transparent, with a sealing member 58 in a vacuum after housing the piezoelectric vibration element 32. As a result, frequency can be adjusted by trimming the electrode, or the like of the piezoelectric vibration element 32 with an irradiation of laser light from an outside after sealing the lid 40.

A structure may be employed in which the lid 40, which is, for example, a metal plate such as kovar, not a transparent material, is bonded by a seam sealing.

The piezoelectric vibration element 32 is made of quartz, for example. Other than quartz, lithium tantalate, lithium niobate or other piezoelectric materials can be used.

In the embodiment, the piezoelectric vibration element 32 is cut from, for example, a single crystal of quartz as described later.

The piezoelectric vibration element 32 is provided with the base 51, and a pair of vibration arms 35 and 36 as shown in FIG. 1. The vibration arms 35 and 36 are divided in two from one end of the base 51 (the right end as viewed in the figure) and extended toward the right direction in parallel with each other.

On the front and back surfaces of the main surface of each of the vibration arms 35 and 36, long grooves 33 and 34, which extend in the longitudinal direction, are preferably formed respectively. As shown in FIGS. 1 and 2, exciting electrodes 37 and 38, which serve as a driving electrode, are disposed in the long grooves.

In the embodiment, the distal part of each of the vibration arms 35 and 36 is gradually widened in its width as slightly tapered, thereby playing a role of a plummet with increased weight, as described later. As a result, the vibration arms easily perform a flexural vibration.

In addition, the piezoelectric vibration element 32 extends in the width direction of the base 51 from the other end. The other end (the left end as viewed in the figure) is apart from the one end, at which the vibration arms are formed, of the base 51 with the given distance BL2 (the length of the base). The piezoelectric vibration element 32 is also provided with the supporting arms 61 and 62 at the positions outside the vibration arms 35 and 36. The supporting arms 61 and 62 extend in the direction, in which each of the vibration arms 35 and 36 extends (the right direction in FIG. 1), and are in parallel with the vibration arms 35 and 36.

Each of the outer shape of the piezoelectric vibration element 32 having a tuning-fork-like shape and the long groove disposed in each vibration arm can be precisely formed, for example, by wet etching a material such as a quartz wafer or the like with a hydrofluoric solution or dry etching it.

As shown in FIGS. 1 and 3, the exciting electrodes 37 and 38 are formed in the long grooves 33 and 34, and the side surface of each vibration arm. In each vibration arm, the electrode in the long groove and the electrode formed on the side surface are paired. Each of the exciting electrodes 37 and 38 is extended to respective supporting arms 61 and 62 as respective lead-out electrodes 37a and 38a. Accordingly, when the piezoelectric device 30 is mounted to a mounting substrate or the like, a driving voltage from an outside is applied to each of the lead-out electrodes 37a and 38a in each of supporting arms 61 and 62 via each electrode part 31 (31-1 and/or 31-2) from the mounting terminal 41, thereby the driving voltage is applied to each of the exciting electrodes 37 and 38.

When the driving voltage is applied to the exciting electrode in the long grooves 33 and 34, electric field efficiency inside the region, in which the long groove of each vibration arm is formed, can increase at the time of being driven.

Namely, as shown in FIG. 5, each of the exciting electrodes 37 and 38 is connected to an alternating current power supply source with cross wiring. An alternating voltage serving as a driving voltage is applied to each of the vibration arms 35 and 36 from the power supply source.

Accordingly, the vibration arms 35 and 36 are excited so as to vibrate in a phase opposite to each other. In a fundamental mode, i.e. a fundamental wave, the vibration arms 35 and 36 are performed a flexural vibration so that their distal sides are moved closer and then apart.

Here, the fundamental wave of the piezoelectric vibration element 32 is, for example, as follows: Q value is 12000; capacitance ratio (C0/C1) is 260; CI value is 57 k$\Omega$; and frequency is 32.768 kHz ("kilo hertz," hereinafter referred to as kHz).

Also, the second harmonic wave is, for example, as follows: Q value is 28000; capacitance ratio (C0/C1) is 5100; CI value is 77 k$\Omega$; and frequency is 207 kHz.

Preferably, the base 51 is provided with a concaved part, which is formed by partially shrinking the dimension in the width direction of the base 51, or cut parts 71 and 72, at its both side edges. The both side edges are located sufficiently apart from the end part, which is adjacent to the vibration arms, of the base 51. Each depth of the cut parts 71 and 72 (dimension q in FIG. 3) is preferably set so that its bottom coincides with the outer side edge of each of the vibration arms 35 and 36, which are adjacent to cuts parts 71 and 72 respectively. For example, it is about 30 μm.

Accordingly, a vibration leakage is suppressed from being leaked to the base 51 and being propagated to the supporting arms 61 and 62 when the vibration arms 35 and 36 perform a flexural vibration. As a result, CI value can be suppressed at low value.

Increasing the depth dimension of cut parts 71 and 72 lowers the stiffness of the base 51 more than is necessary, even though it is effective to reduce a vibration leakage, thereby harming stability of the flexural vibration of the vibration arms 35 and 36.

Thus, a through hole 80 is provided in the embodiment. The through hole 80 is formed at the position that is around the center in the width direction of the base 51, and more adjacent to the vibration arms 35 and 36 than connecting part 53 at which each of the supporting arms 61 and 62 is integrally connected to the base 51.

The through hole 80 is a hole having a rectangular shape and passing through the front and back faces of the base 51 as shown in FIGS. 1 and 2. The hole shape is not limited, as a round shape, an oval shape, a square shape, and the like may be employed.

This makes it possible to reduce CI value by further suppressing a vibration leakage without largely lowering the stiffness of the base 51 compared to forming the cut parts 71 and 72 deep.

Here, the length r of the through hole 80 in the width direction of the base 51 is preferably about 50 μm. The ratio of the dimension r of the through hole 80 and depth q of the cut part 71 to the dimension e, i.e.$(r+q)/e$, is set from 30% to 80% so as to effective to reduce a vibration leakage and influence of the bonded parts through the supporting arm 61.

In addition, in the embodiment, the distance (dimension p) between the side of the base 51 and the supporting arm 61 or 62 is from 30 to 100 μm in order to miniaturize a package dimension.

Further, in the embodiment, the other end part 53 (connecting part), from which each of the supporting arms 61 and 62 extends, of the base 51 is located so as to keep the distance BL2 sufficiently apart from a footing part 52 of the vibration arms 35 and 36 as shown in FIG. 1.

The dimension of the distance BL2 is preferably more than the arm width dimension W2 of the vibration arms 35 and 36.

Namely, when the vibration arms 35 and 36 of a tuning fork type resonator element perform a flexural vibration, the area in which the vibration leakage is propagated toward the base 51 has a correlation with the arm width dimension W2 of the vibration arms 35 and 36. The inventor focuses attention to this point, having knowledge that the position serving as a base end of the supporting arms 61 and 62 should be disposed at an adequate position.

Therefore, in the embodiment, the structure can be achieved in which the vibration leakage from the vibration arms 35 and 36 is more surely suppressed from being propagated to the supporting arms 61 and 62 by the following manner: the part 53 (connecting part), which serves as the base end of the supporting arms 61 and 62, is chosen so that the distance from the footing part 52 of the vibration arms to the part 53 is more than the dimension corresponding to the size of the arm width dimension W2 of the vibration arms. Therefore, in order to obtain advantageous effects of the supporting arms, which will be described later, with suppressing CI value, it is preferable that the position of 53 is apart from the footing part 52 (i.e. one end part of the base 51) of the vibration arms 35 and 36 by the distance BL2.

Due to the same reason, it is preferable that the positions at which the cut parts 71 and 72 are formed are apart from the footing part 52 of the vibration arms 35 and 36 by the distance that is more than the size of the arm width dimension W2 of the vibration arms 35 and 36. Therefore, the cut parts 71 and 72 are formed at the positions, which include a part where the supporting arms 61 and 62 are integrally connected to the base 51, and are more adjacent to the vibrating arms from the part.

In addition, it was confirmed that a drive level characteristic could be adjusted to a level of a normal piezoelectric vibration element by forming the cut parts 71 and 72 at the positions parted from the footing part (foot) by 1.2× the arm width dimension W2 or more.

Here, since the supporting arms 61 and 62 are irrelevant to the vibration, no specific conditions are required to the arm width. However, it is preferable that the width is larger than that of the vibration arm in order to assure a supporting structure.

Consequently, in the embodiment, the width BW2 of the base 51 can be achieved to be 500 μm by being composed of the followings: the vibration arms having the arm width W2 of approximately from 40 to 60 μm; the supporting arms 61 and 62 having a width of approximately 100 μm; and the distance MW2 between the vibration arms is approximately from 50 to 100 μm. This is nearly the same of the width of the piezoelectric vibration element 1 in FIG. 10, and shorter length. As a result, this makes it possible to be fully housed in the package having the same size as that of the conventional one. The embodiment can obtain the following advantageous effects while achieving such miniaturization.

In the piezoelectric vibration element 32 in FIG. 1, since the supporting arms 61 and 62 are bonded to the package 57 with the conductive adhesive 43, the stress change, which is produced at the bonding position due to the change of surrounding temperature or drop shock or the like, hardly affects the vibration arms 35 and 36 due to the crooked distance from the bonding position of the supporting arms 61 and 62 to the other end part 53 of the base 51, and further the distance of the length of the base 51, which is more than the distance BL2. As a result, particularly, the temperature characteristics show well.

In contrast, a vibration leakage from the vibration arms 35 and 36, which perform a flexural vibration, is hardly propagated, since the vibration leakage is reached to the supporting arms 61 and 62 through the base 51 with including the given length, which is more than the distance BL2, of the base 51.

If the length of the base 51 is extremely short, it can be considered that a situation difficult to be controlled occurs since a leaked component of a flexural vibration spreads over the supporting arms 61 and 62. However, in the embodiment, such situation is thoroughly avoided.

In addition to the advantageous effects, since the supporting arms 61 and 62 are extended from the other end part 53 (connecting part) of the base 51 in the width direction, and extended in the same direction of the vibration arms 35 and 36 at outside of the vibration arms 35 and 36, the whole size can be made compact.

Further, in the embodiment, the tops of the supporting arms 61 and 62 are formed so as to be closer to the base 51 than the tops of the vibration arms 35 and 36 as shown in FIG. 1. On this point, the size of the piezoelectric vibration element 32 also can be made compact.

Moreover, as compared with the structure of FIG. 10, the followings can easily be understood. In FIG. 10, the conductive adhesives 7 and 8 are applied to the lead-out electrodes 5 and 6, both of which are closely located. Because of this structure, the bonding process should be carried out by applying the adhesive to extremely narrow area (of the package) so that they are not contacted each other for avoiding a short, and by paying attention, even after bonding, not to flow out the adhesive to cause the short before curing it. As a result, the process is made difficult.

In contrast, in the piezoelectric vibration element 32 in FIG. 1, the conductive adhesives 43 are merely applied to the electrode parts 31-1 and 31-2 that are respectively located at an approximately intermediate position of the supporting arms 61 and 62, both of which are spaced apart across the width direction of the package 57. This causes seldom difficulties described as above, and also no worries of the short.

FIG. 4 is a sectional view of the vibration arm 36 taken along the line C-C in FIG. 1. Exciting electrodes are omitted for easy illustrating and understanding. In this regard, the vibration arm 35 shows the same sectional view (not shown). Only the vibration arm 36 will be explained to omit a redundant description.

As described above, the long groove 34 is formed to a main surface of the vibration arm 36. Namely, in the embodiment, the long groove 34 is respectively formed on the front surface (upper surface) and the back surface (lower surface) of the vibration arm 36 so as to extend in the longitudinal direction. Here, the broken line KL in the figure shows the center position in relation to the arm width dimension c of the vibration arm 35.

The piezoelectric vibration element of the embodiment is formed by using, for example, a quartz wafer, which has a size capable for dividing it into a several number or a many number of the piezoelectric vibration elements 32, as a piezoelectric substrate out of piezoelectric materials in a manufacturing process described later. Accordingly, the piezoelectric substrate is cut from a piezoelectric material, for example a single crystal of quartz crystal so that X, Y, and Z-axes shown in FIG. 3 become an electrical axis, a mechanical axis, and an optical axis, respectively since the piezoelectric substrate is processed into the piezoelectric vibration element 32 in FIG.

Figure 9:
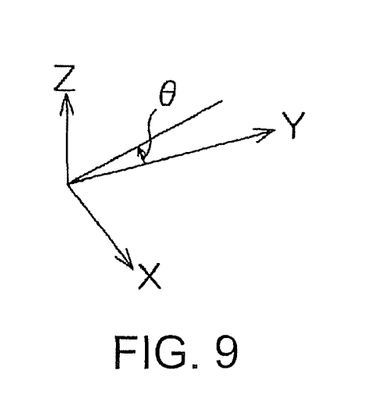
FIG. 9 shows coordinate axes of a quartz Z plate.

3 through the processes. The quartz wafer is achieved by cutting and polishing a quartz Z plate so as to be a given thickness. The quartz Z plate is cut by being rotated within a range of zero to five degrees in clock wise about the Z-axis (θ in FIG. 9) in the orthogonal coordinate system composed of the X, Y, and Z-axes when cutting it from the single crystal of quartz.

Regarding the dimension of the thicknesses HK2 and MK2 of walls sandwiching the long groove 34, the dimension of the thickness HK2 of the wall, which is located at a minus X-axis side, is larger as shown in FIG. 4. Therefore, the gravity center of the vibration arm 36 is obviously present at the minus X-axis side than the centerline KL.

Accordingly, in the embodiment, the center position of width dimension of each long groove 34 is decentered to the minus X-axis side compared to before by changing the position to which each long groove 34 is formed.

The reason is as follows. If the center position in the width direction of the long groove 34 coincides with the center position in the width direction of the vibration arm in the vibration arm 36 shown in FIG. 4 in a previous manner (refer to FIG. 12), the center in the width direction of the long groove 34 does not coincide with the gravity center position. As a result, the flexural vibration of vibration arms is harmed.

Accordingly, the center position MC in the width dimension of the long groove 34 is decentered to the minus X-axis direction. The center position MC in the width dimension of the long groove 34 is resultantly located closer to the gravity center position in the width direction of the vibration arm, thereby a weight balance between the right and left vibrating arms can be adjusted. This makes it possible to achieve a stable flexural vibration of vibration arms even though a piezoelectric vibration element is miniaturized with a small groove width of a long groove, and a fin 81 reduced in size. As a result, the piezoelectric vibration element 32 having an excellent drive level characteristic can be provided.

Here, in order to achieve such a structure, a half-etching may be carried out in an etching process (half-etching) of a long groove, which will be described later as follows. The half-etching may be carried out after shifting a mask in the minus X-axis direction by the distance CW, for example, instead of a previous manner in which a half-etching is carried out so that the center of a region to be half etched coincides with the centerline KL.

In this case, regarding the dimension of the distance between the outer edge of the long groove 34 formed to the vibration arm 36 and the outer edge of the vibration arm 36, the distance dimension m1 in the plus X-axis side is larger than the distance dimension m2 in the minus X-axis side after forming the long grooves 34 as shown in FIG. 4. Namely, the distance dimension between the outer edge of the long groove 34 formed to the vibration arm 36 and the outer edge of the vibration arm 36 needs to be surely provided at both plus and minus X-axis sides, thereby electrodes are reliably polarized. The dimension, however, adequately realizes the above-described structure. In the structure, a position to place a mask is well designed so that the distance dimension m1 in the plus X-axis side is larger than the distance dimension m2 in the minus X-axis side, thereby the center position in the width direction of the long groove is shifted in the minus X-axis direction.

Specifically, the dimension m2 in FIG. 4 becomes extremely small, if the gravity center of the vibration arm 36 is adjusted to overlap the centerline KL by shifting the center position of the long groove 34 in the minus X-axis direction when the gravity center of the vibration arm 36 is present at about 3 μm from the centerline KL in the minus X-axis side. This makes it difficult to polarize electrodes at the part. Accordingly, the long groove 34 is decentered (shifted) in the minus X-axis direction by about from 1 μm to 3 μm, thereby a relatively stable flexural vibration can be achieved without such setback.

Figure 7:
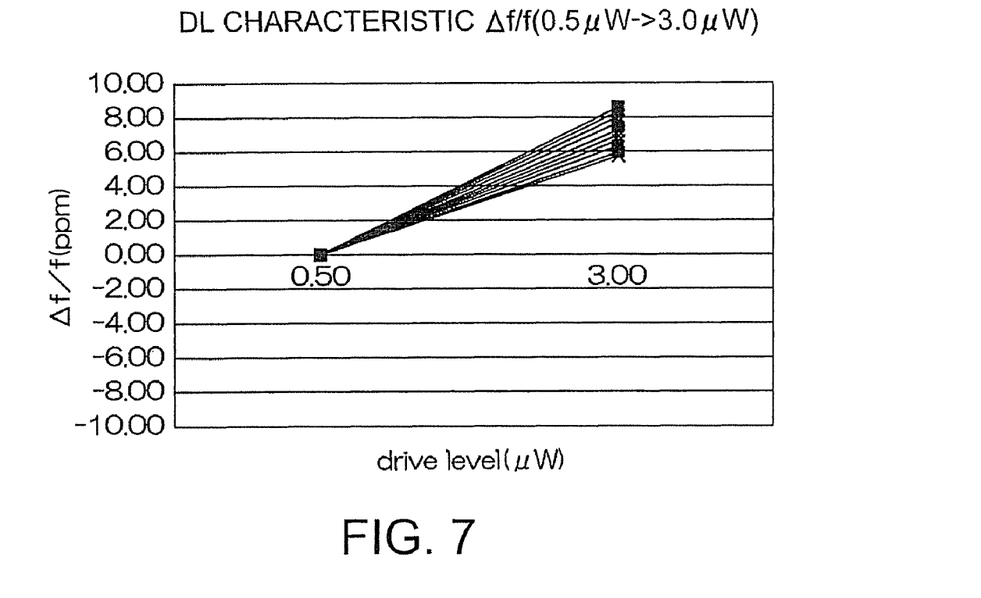
FIG. 7 is a graph illustrating a drive level characteristic of the piezoelectric vibration element used in the piezoelectric device in FIG. 1.

FIG. 7 shows a drive level characteristic of the piezoelectric vibration element 32 of the embodiment.

In the piezoelectric vibration element 32, a weight balance between the right and left vibration arms can be adjusted by decentering the center position in the width dimension of the long groove 34 of the vibration arm in the minus X-axis direction. As a result, the drive level characteristic shown in FIG. 7 is extremely favorable as is easily understood by referring to FIG. 13.

Next, the preferable detailed structure of the piezoelectric vibration element 32 of the embodiment will be explained referring to FIGS. 3 and 5.

Since each of the vibration arms 35 and 36 of the piezoelectric vibration element 32 shown in FIG. 3 has the same shape, the vibration arm 36 will be explained. The vibration arm width c is the widest at the base end part T at which each of vibration arms is extended from the base 51. A first shrunk width part TL, which drastically reduces the width between the positions of T to U, is formed. The position of T is the footing part of the vibration arm 36. The position U is apart from the position T toward the distal side of the vibration arm 36 with a little distance. A second shrunk width part, which gradually and continuously decreases the width from the position of U to the position of P, namely, across the distance of CL on the vibration arm. The position of U is the end of the first shrunk width part TL. The position of P is apart from the position of U further toward the distal side of the vibration arm 36.

Accordingly, the vibration arm 36 has a high stiffness around the footing part close to the base by providing the first shrunk width part TL. The vibration arm 36 also has a stiffness continuously decreased by forming the second shrunk width part CL, which is formed from the point U serving as the end of the first shrunk width part to the top. The part of P is the changing point P at which the arm width is changed. Further, it is a constricted position of the vibration arm 36 from the shape point of view. Thus, it also can be expressed as the constricted position P. In the vibration arm 36, the arm width extends from the changing point P to the distal side with the same width, or preferably, with the width gradually and slightly widened as shown in the figure.

Here, the longer the long grooves 33 and 34 in FIG. 3, more increasing the electric field efficiency of the material forming the vibration arms 35 and 36. Here, the longer the long grooves, the lower CI value of the tuning fork type resonator element, at least j/b is up to approximately 0.7, where b is the whole length of vibration arm and j is the length of the long grooves 33 and 34 from the base 51. Therefore, j/b is preferably from 0.5 to 0.7. In the embodiment, the whole length b of the vibration arm 36 is, for example, approximately 1200 μm in FIG. 3.

In addition, when the length of the long groove is adequately elongated to thoroughly suppress CI value, a next arising problem is the CI value ratio (CI value of harmonic wave/CI value of fundamental wave) of the piezoelectric vibration element 32.

Namely, if the CI value of a harmonic wave is smaller than the CI value of the fundamental wave since the CI value of the harmonic wave is simultaneously suppressed by reducing the CI value of the fundamental wave, oscillation with the harmonic wave easily occurs.

Accordingly, in addition to elongating the long groove to reduce the CI value, the changing point P is further provided closely to the top of the vibration arm. This allows the CI value ratio (CI value of harmonic wave/CI value of fundamental wave) to be more increased while reducing the CI value.

Namely, the stiffness of a root part, i.e. in the vicinity of the footing part, of the vibration arm 36 is strengthen by the first shrunk width part TL. This allows the flexural vibration of the vibration arms to be more stable. As a result, the CI value can be suppressed by adding the advantageous effect of forming the through hole 80.

Since the second shrunk width part CL is provided, the stiffness of the vibration arm 36 is gradually lowered from its footing part, toward the distal side, to the constricted position P serving as the changing point of the arm width. From the constricted position P to further the distal side, the stiffness of the vibration arm 36 is gradually increased because the long groove 34 is not provided, and the arm width c is gradually widened.

Accordingly, it can be considered that a "node" of the vibration in the second harmonic wave can be shifted to the position closer to the distal side of the vibration arm 36. As a result, lowering the CI value of the second harmonic wave cannot be provoked while suppressing the CI value of the fundamental wave even though the electric field efficiency of the piezoelectric material is increased by elongating the long groove 34. Consequently, the CI value ratio is almost certainly increased by preferably providing the changing point P of the arm width closer to the distal side of the vibration arm from the end part of the long groove as shown in FIG. 3, allowing an oscillation with a harmonic wave to be prevented.

Moreover, according to researches by the inventor, j/b, an arm width shrunk ratio M, and the CI value ratio corresponding to them are correlated, where b is the whole length of the vibration arm, j is the length of the grooves 33 and 34 from the base 51, M is the ratio of the maximum width to the minimum width of the vibration arm 36, and CI value ratio is the ratio of the CI value of the second harmonic wave to the CI value of the fundamental wave.

It was confirmed that an oscillation with a harmonic wave was able to be prevented by the CI value ratio that became more than one by increasing the arm width shrunk ratio M, which is the ratio of the maximum width to the minimum width of the vibration arm 36, so as to be more than 1.06 if j/b is 61.5%.

As a result, the piezoelectric vibration element can be provided that can control the CI value of the fundamental wave at low value, and does not deteriorate a drive level characteristic even though it is wholly miniaturized.

Next, more preferable structure of the piezoelectric vibration element 32 will be explained.

The wafer thickness, i.e. the thickness of quartz wafer forming a piezoelectric vibration element, shown in FIG. 5 as the dimension x is preferably from 70 to 130 μm.

The whole length of the piezoelectric vibration element 32 shown in FIG. 3 as the dimension a is approximately from 1300 to 1600 μm. It is preferable for miniaturizing a piezoelectric device that the dimension b, which is the whole length of the vibration arm, is from 1100 to 1400 μm, while the whole width d of the piezoelectric vibration element 32 is from 400 to 600 μm. Accordingly, in order to miniaturize the tuning fork part, it is required for ensuring a supporting effect that the width dimension e of the base 51 is from 200 to 400 μm, while the width f of the supporting arm is from 30 to 100 μm.

The dimension k between the vibration arms 35 and 36 in FIG. 3 is preferably from 50 to 100 μm. If the dimension k is less than 50 μm, it is difficult to sufficiently lessen a fin shaped convex part, which is an irregular shaped part due to an anisotropy in etching, in the plus X-axis direction on the side of the vibration arm shown in FIG. 5 with numeral 81 when the outer shape of the piezoelectric vibration element 32 is formed by wet etching through a quartz wafer, which will be described later. If the dimension k is 100 μm or more, the flexural vibration of vibration arms may be unstable.

In addition, both dimensions m1 and m2 are from 3 to 15 μm. Each of them is the dimension between the outer edge of the long groove 33 and the outer edge of the vibration arm in the vibration arm 35 (the same as in the vibration arm 36) in FIG. 5 The electric field efficiency is improved by the dimensions m1 and m2 of 15 μm or less. The dimensions m1 and m2 of 3 μm or more have an advantage to reliably polarize electrodes.

The first shrunk width part TL having the width dimension m of 11 μm or more in the vibration arm 36 in FIG. 3 can be expected to show a definite effect on suppressing CI value.

In the vibration arm 36 in FIG. 3, it is preferable that the arm width is widened from the changing point P of an arm width to the distal side by approximately from 0 μm to 20 μm with respect to the width of the changing point P of an arm width, which is the position at which the arm width of the vibration arm 36 is the minimum. Widening the width over the width described above may deteriorate the stability of a flexural vibration, since the distal part of the vibration arm 36 is too much weighted.

An irregular shaped part 81 is formed on one side of the outside of the vibration arm 35 (the same as in the vibration arm 36) in FIG. 5. The irregular shaped part 81 has a fin shape and is protruded in the plus X-axis direction. This is formed as etching remains due to an anisotropy etching of quartz when a piezoelectric vibration element is wet etched for forming its outer shape. In order to achieve a low CI value by increasing field efficiency, it is preferable that the protruded amount v of the irregular shaped part 81 is reduced within 5 μm by performing the etching in the etching solution containing hydrofluoric acid and ammonium fluoride for from 9 to 11 hours.

It is preferable that the width dimension of the long groove, which is shown as the dimension g in FIG. 3, is approximately from 60% to 90% with respect to the arm width c of the vibration arm in the region, in which the long groove is formed, of the vibration arm. The arm width c varies at the position along the longitudinal direction of the vibration arm since the first and second shrunk width parts are formed to the vibration arms 35 and 36. The width g of the long groove is approximately from 60% to 90% with respect to the maximum width of the vibration arm. If the width of the long groove is smaller than this, the electric field efficiency is lowered, resulting in CI value being increased.

Moreover, the end position, which is adjacent to the base 51, of the long grooves 33 and 34 is preferably the same as the footing part of the vibration arms 35 and 36 as viewed in FIG. 3, i.e. the position of T, or is in the range in which the first shrunk width part TL is present and slightly apart from the position T toward the distal side of the vibration arm, and, particularly, is not preferably in adjacent to the base end of the base 51 from the position of T.

In addition, the whole length h of the base 51 in FIG. 3, which is approximately 30% with respect to the whole length a of the piezoelectric vibration element 32 conventionally, can be achieved to be approximately from 15% to 25% by employing the cut part, etc., in the embodiment. As a result, the miniaturization is achieved.

Figure 6:
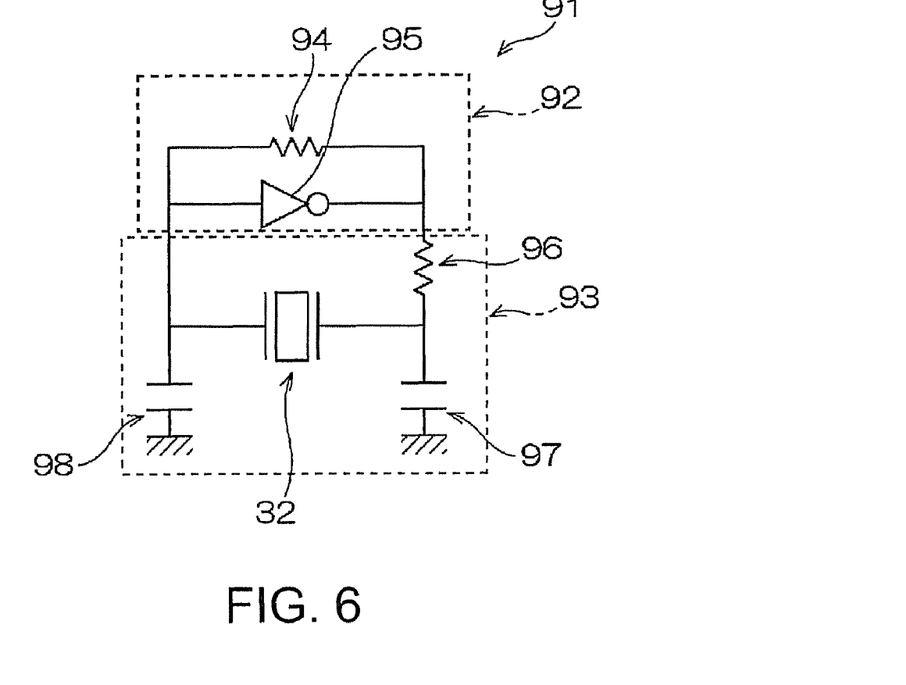
FIG. 6 is a circuit diagram illustrating an example of an oscillation circuit using the piezoelectric vibration element in FIG. 1.

FIG. 6 is a circuit diagram illustrating an example of an oscillation circuit when a piezoelectric oscillator is structured by using the piezoelectric vibration element 32 of the embodiment.

An oscillation circuit 91 includes an amplifying circuit 92 and a feedback circuit 93.

The amplifying circuit 92 is provided with an amplifier 95 and a feedback resistor 94. The feedback circuit 93 is provided with a drain resistor 96, capacitors 97 and 98, and the piezoelectric vibration element 32.

Here, in FIG. 6, the feedback resistor 94 is, for example, approximately 10 MΩ (mega ohm). The amplifier 95 can employ a CMOS inverter. The drain resistor 96 is, for example, from 200 to 900 kΩ (kilo ohm). Each of the capacitor 97 (drain capacitance) and the capacitor 98 (gate capacitance) is from 10 to 20 pF (pico farad).

(Method for Manufacturing a Piezoelectric Device)

Figure 8:
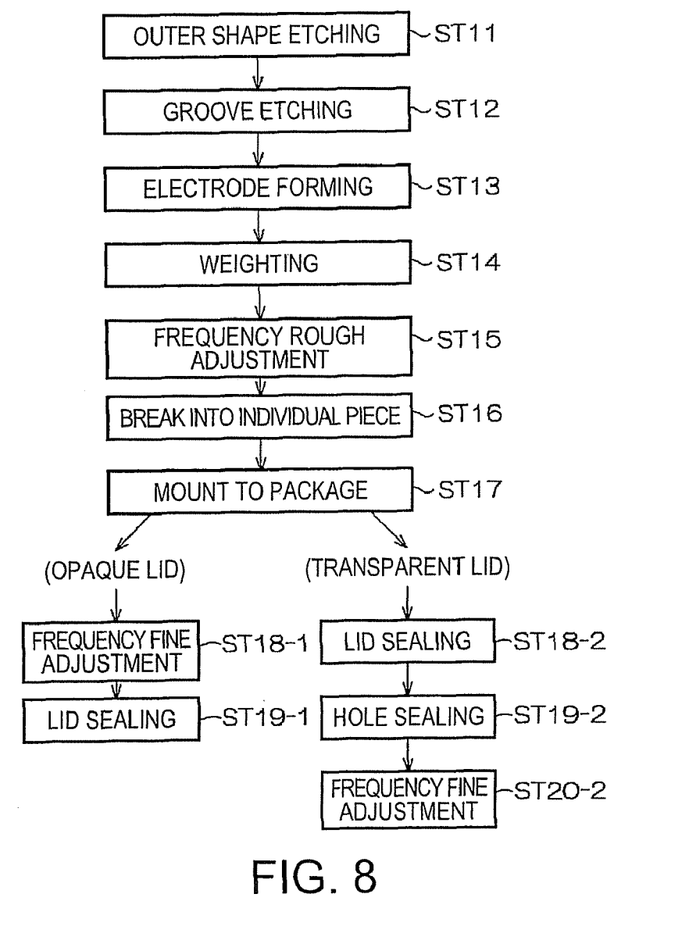
FIG. 8 is a flow chart illustrating one example of a method for manufacturing the piezoelectric device in FIG. 1.

Next, an example of a method for manufacturing the piezoelectric device will be explained referring to a flow chart in FIG. 8.

The piezoelectric vibration element 32, the package 57, and the lid 40 in the piezoelectric device 30 are individually manufactured.

(Method for Manufacturing a Lid and a Package)

The lid 40 is prepared as the lid having a suitable size for sealing the package 57 by cutting, for example, a glass plate having a given size.

The package 57 is formed, as above described, by laminating a number of substrates made of aluminum-oxide ceramic green sheets and then firing the substrates. In the forming, each of the number of substrates is provided with a given hole inside thereof so as to form the inner space S as predetermined when they are laminated.

(Method for Manufacturing Piezoelectric Vibration Element)

First, a piezoelectric substrate is prepared. Then, a given number of piezoelectric vibration elements are simultaneously formed from one piezoelectric substrate by etching their outer shapes (outer shape etching).

Here, as already described, a quartz wafer having a size capable for dividing it into a several number or a many number of the piezoelectric vibration elements 32 is used from piezoelectric materials as the piezoelectric substrate.

In the outer shape etching, the piezoelectric substrate exposed as an outside part from the outer shape of the piezoelectric vibration element is subjected to the etching of the outer shape of the piezoelectric vibration element by using, for example, a hydrofluoric acid solution as an etchant with a mask such as a corrosion resistant film (not shown). As the corrosion resistant film, for example, a metal film such as gold that is vapor deposited on chromium serving as an underlayer, or the like can be used. The etching process varies depending on the concentration, kind, temperature, and so forth of the hydrofluoric acid solution.

Here, the wet etching in the outer shape etching process shows the following anisotropic etching to the electrical axis X, mechanical axis Y, and optical axis Z shown in FIG. 3 as the etching proceeds.

Namely, the etching rate in X-Y plain of the piezoelectric vibration element 32 is follows: in the plus X direction, the progression of etching is fast in the plain in the direction of 120 degrees with respect to the X-axis and in the plain in the direction of minus 120 degrees with respect to the X-axis; and, in the minus X direction, the progression of etching is slow in the inside face in the direction of 30 degrees with respect to the X-axis and in the inside face in the direction of minus 30 degrees with respect to the X-axis.

Likewise, the progression of etching speed in the Y direction is fast in the plus 30 and minus 30 degrees. In the plus Y direction, the progression of etching speed is slow in the plus 120 and minus 120 degrees directions with respect to the Y-axis.

Due to the anisotropy in etching progression, the irregular shaped part protruded as a fin shape, i.e. "fin" 81 is formed on the outer side of each of vibration arms of the piezoelectric vibration element 32 as indicated as the numeral 81 in FIG. 5.

In the embodiment, the fin 81 (irregular shaped part) shown in FIG. 4 can be eliminated or reduced in tiny size by the following manner in ST11. For example, a quartz wafer having a thickness of about 100 μm is used as a piezoelectric substrate. An etchant is used containing hydrofluoric acid and ammonium fluoride. Etching the quartz wafer with the etchant for sufficient time period, i.e. for from 9 to 12 hours, particularly for about 11 hours.

In the process, the through hole 80 as well as the outer shape of the piezoelectric vibration element 32 including the cut parts 71 and 72 are simultaneously formed. When the process is completed, many piezoelectric vibration elements 32, each of which is connected to the quartz wafer at the vicinity of the base 51 with a slim connecting part, are achieved as their outer shapes are completed.

(Half Etching Process for Forming a Groove)

Next, the resist (not shown) for forming a groove remains as a corrosion resistant film at the part to which the groove is not formed so as to leave both wall parts sandwiching each long groove as shown in FIG. 5. Then, the front and back sides of each of the vibration arms 35 and 36 are wet etched with the same etching condition of the outer shape etching so as to form the bottom corresponding to each long groove (ST12).

Here, with reference to FIG. 5, the depth of the groove indicated by the symbol t is approximately from 30% to 45% with respect to the whole thickness x. As for the t, if it is 30% or less of the whole thickness x, there can be a case where the electric field efficiency cannot sufficiently be improved. If it is 45% or more, there can be a case where a flexural vibration is adversely affected or strength is insufficient due to the insufficient stiffness.

Here, either of the outer shape etching and the groove etching, or both of them can be performed by dry etching. In this case, for example, a metal mask is disposed in each time on the piezoelectric vibration substrate (quartz wafer) so as to cover the outer shape of the piezoelectric vibration element 32, or a region corresponding to a long groove after forming the outer shape. The piezoelectric substrate with the mask is, for example, put into a chamber (not shown), and then an etchant gas is supplied at a given degree of vacuum in the chamber so as to produce etching plasma. As a result, dry etching can be performed. Namely, for example, a freon gas cylinder and an oxygen gas cylinder are connected to a vacuum chamber (not shown), and further an exhausting pipe is provided to the vacuum chamber so as to vacuum the chamber to a given degree of vacuum.

When inside the vacuum chamber is vacuum exhausted to a given degree of vacuum, and freon gas and oxygen gas are supplied and charged to reach a given pressure of the mixed gas of the two, a direct-current voltage is applied to generate plasma. The mixed gas containing ionized particles hits the piezoelectric material exposed from the metal mask. The bombardment mechanically chips away and scatters the piezoelectric material. As a result, etching proceeds.

(Electrode Forming Process)

Next, as a metal serving as the electrode, for example, gold is deposited on the entire surface by vapor deposition, sputtering, or the like. Then, the driving electrode described in FIGS. 1 and 5 is formed by photolithography using a resist exposing the part on which the electrode is not formed (ST13).

Subsequently, weighted electrodes (metal films) 21 are formed on the distal part of each of the vibration arms 35 and 36 by sputtering or vapor deposition (ST14). The weighted electrodes 21 are not used for driving the piezoelectric vibration element 32 with applying a voltage, but are utilized for a frequency adjustment described later.

Next, frequency is roughly adjusted on the wafer (ST15). The rough adjustment is the frequency adjustment by a mass reducing method in which a part of the weighted electrodes 21 are partially evaporated by a irradiation of an energy beam such as laser light.

Subsequently, the slim connecting part connected to the wafer is broken off so that an individual piece forming the piezoelectric vibration element 32 is provided (ST16).

Then, as described in FIG. 1, the conductive adhesive 43 is applied on each of the electrodes 31-1 and 31-2 of the package 57. On the conductive adhesives 43, the supporting arms 61 and 62 are placed. By heating and curing the adhesives, the piezoelectric vibration element 32 is bonded to the package 57 (ST17).

Here, the conductive adhesive 43 is, for example, one that is composed of a binder utilizing synthetic resins or the like, and conductive particles such as silver particles or the like that are mixed into the binder, and can simultaneously perform a mechanical connection and an electrical connection.

If the lid 40 is made of an opaque material such as metal or the like, the through hole 27 described in FIG. 2 is not provided. Then, while applying a driving voltage to the piezoelectric vibration element 32 and monitoring a frequency, the frequency adjustment serving as a fine tuning is performed, for example, by the mass reducing method in which the distal side of the weighted electrode 21 of the vibration arm 35 and/or 36 of the piezoelectric vibration element 32 is irradiated by laser light (ST18-1).

Subsequently, the lid 40 is bonded to the package 57 by seam welding or the like in vacuum (ST19-1). After required inspections, the piezoelectric device 30 is completed.

Alternatively, when the package 57 is sealed with the lid 40, which is transparent, the lid 40 is bonded to the package 57 after bonding the piezoelectric vibration element 32 in the step of ST17 (ST18-2).

In this case, for example, the heating process is performed in which the lid 40 is bonded to the package 57 by heating a low melting point glass or the like. In this time, gas is produced from the low melting point glass and the conductive adhesive and the like. Accordingly, the gas is exhausted from the through hole 27 described in FIG. 2 by heating (degassing). Then, a metal ball or pellet made of gold tin, more preferably, gold germanium, or the like is disposed to a stepped part 29 in vacuum, being melt by an irradiation of laser light, or the like. As a result, the sealing member 28 made of metal in FIG. 2 hermetically seals the through hole 27 (ST19-2).

Then, as shown in FIG. 2, the distal side of the weighted electrode 21 of the vibration arm 35 and/or 36 of the piezoelectric vibration element 32 is irradiated by laser light transmitted through the lid 40 made of glass, which is transparent and made of such as glass or the like. As a result, the frequency adjustment serving as a fine tuning is performed by the mass reducing method (ST20-2). After required inspections, the piezoelectric device 30 is completed.

It should be understood that the invention is not limited to the above-described embodiments. The structure of each embodiment and modification example can be appropriately combined or omitted, and an additional structure not shown can also be combined therewith.

In addition, the invention can be applied to not only the one in which the piezoelectric vibration element is housed in a box shaped package, but also to the one in which the piezoelectric vibration element is housed in a cylindrical package, the one in which the piezoelectric vibration element functions as a gyro sensor, and further to any piezoelectric devices utilizing a piezoelectric vibration element regardless the name of the piezoelectric vibration element, piezoelectric oscillator, and the like. Moreover, a pair of vibration arms is formed in the piezoelectric vibration element 32. However, the number of vibration arms is not limited to this, but can be three or four or more.

What is claimed is:

1. A piezoelectric vibration element including a base made of a piezoelectric material and a plurality of vibration arms extending from the base, the piezoelectric vibration element comprising:

a long groove formed along a main surface of each of the plurality of vibration arms, each long groove including a center position in a width direction of the long groove that is offset from a hypothetical line that extends through the center of gravity of the vibration arm and is parallel to a longitudinal axis of the vibration arm;

an exciting electrode provided inside each of the long grooves;

a first shrunk width part in which a width of each arm is gradually reduced from the base toward a distal end of each of the plurality of vibration arms;

a second shrunk width part in which a width of each arm is gradually reduced from the first shrunk width part toward a distal end of each of the plurality of vibration arms, the second shrunk width part decreasing the width of each arm to a different degree than the first shrunk width part; and a changing point P disposed at a distal end of the second shrunk width part and between the distal end of the long groove and a distal end of each arm;

wherein the width of each arm is constant from the changing point P to the distal end of each arm.

2. The piezoelectric vibration element according to claim 1, wherein a distance dimension m1 between an outer edge of the long groove and an outer edge of the vibration arm in a plus X-axis direction is larger than a distance dimension m2 between an outer edge of the long groove and an outer edge of the vibration arm in a minus X-axis direction.

3. The piezoelectric vibration element according to claim 1, further comprising a supporting arm that is extended in a width direction from another end side of the base having a predetermined length and extended in a common direction with the vibration arms outboard the vibration arms, another end side being located by the predetermined distance from one side of the base, the vibration arm extending from the one side.

4. The piezoelectric vibration element according to claim 3, wherein the base includes a through hole at a position more adjacent to the vibration arm than a connecting part in which the supporting arm and the base are integrally connected.

5. The piezoelectric vibration element according to claim 1, wherein the base includes a cut part formed by reducing the base in the width direction.

6. The piezoelectric vibration element according to claim 5, wherein the cut part is formed to the base with a distance of 1.2 times of the arm width or more from a footing part of each vibration arm.

7. The piezoelectric vibration element according to claim 1, wherein the width of each arm in the second shrunk width part is less than the width of each arm in the first shrunk width part.

8. The piezoelectric vibration element according to claim 1, wherein the first shrunk width part and the second shrunk width part are disposed between the base and the changing point P.

9. The piezoelectric vibration element according to claim 1, wherein the first shrunk width part is linear along its length and the second shrunk width part is linear along its length.

10. The piezoelectric vibration element according to claim 9, wherein a slope of the first shrunk width part is different than a slope of the second shrunk width part.

11. The piezoelectric vibration element according to claim 9, wherein a slope of the first shrunk width part is greater than a slope of the second shrunk width part such that a width of each vibration arm decreases more gradually at the second shrunk width part when compared to the first shrunk width part.

12. The piezoelectric vibration element according to claim 1, wherein a slope of the first shrunk width part is different than a slope of the second shrunk width part.

13. The piezoelectric vibration element according to claim 1, wherein a slope of the first shrunk width part is greater than a slope of the second shrunk width part such that a width of each vibration arm decreases more gradually at the second shrunk width part when compared to the first shrunk width part.

* * * * *